(12) United States Patent
Patel et al.

(10) Patent No.: US 7,818,611 B2
(45) Date of Patent: Oct. 19, 2010

(54) MEMORY DEVICE INTERNAL PARAMETER RELIABILITY

(75) Inventors: Vipul Patel, Sunnyvale, CA (US); Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/435,206

(22) Filed: May 4, 2009

(65) Prior Publication Data

US 2009/0222689 A1 Sep. 3, 2009

Related U.S. Application Data

(63) Continuation of application No. 11/509,139, filed on Aug. 24, 2006, now Pat. No. 7,529,969.

(51) Int. Cl.
G06F 11/00 (2006.01)
(52) U.S. Cl. .......................................................... 714/6
(58) Field of Classification Search ................. 714/2–8, 714/15, 16, 20, 21, 30, 37, 42, 54
See application file for complete search history.

(56) References Cited

U.S. PATENT DOCUMENTS

| | | | |
|---|---|---|---|
| 5,295,101 A * | 3/1994 | Stephens et al. ............ 365/200 |
| 5,974,564 A * | 10/1999 | Jeddeloh ......................... 714/8 |
| 6,035,432 A * | 3/2000 | Jeddeloh ...................... 714/763 |
| 6,259,637 B1 | 7/2001 | Wood et al. | |
| 6,668,341 B1 | 12/2003 | Krauch et al. | |
| 6,748,562 B1 * | 6/2004 | Krech et al. ................. 714/723 |
| 6,895,537 B2 * | 5/2005 | Kawagoe et al. ............ 714/710 |
| 6,934,203 B2 * | 8/2005 | Choi ........................... 365/200 |
| 7,213,191 B2 | 5/2007 | Chao | |
| 7,307,881 B2 | 12/2007 | Chen et al. | |
| 7,529,969 B1 * | 5/2009 | Patel et al. ...................... 714/6 |
| 7,571,362 B2 * | 8/2009 | Pellicone et al. ............ 714/723 |
| 2003/0163756 A1 * | 8/2003 | George .......................... 714/5 |
| 2004/0117686 A1 | 6/2004 | Vainsencher et al. | |
| 2004/0133734 A1 * | 7/2004 | Jordan et al. ................. 711/103 |
| 2004/0153903 A1 | 8/2004 | Ditewig et al. | |
| 2005/0091569 A1 | 4/2005 | Chao | |
| 2006/0018159 A1 * | 1/2006 | Picca et al. ............. 365/185.17 |
| 2006/0098484 A1 * | 5/2006 | Roohparvar ........... 365/185.09 |
| 2006/0155882 A1 | 7/2006 | Jochemsen et al. | |

* cited by examiner

Primary Examiner—Nadeem Iqbal
(74) Attorney, Agent, or Firm—Schwegman, Lundberg & Woessner, P.A.

(57) ABSTRACT

Embodiments herein may store redundant copies of an operational parameter associated with an internal operation of a memory device. The redundant copies and associated parity bits may be stored in sets of writeable, non-volatile storage cells. A working area of the memory device may subsequently be populated with one or more redundant copies of the operational parameter, with a flag associated with the operational parameter, or with both. Other embodiments are described and claimed.

29 Claims, 3 Drawing Sheets

MEMORY DEVICE INTERNAL PARAMETER RELIABILITY

RELATED APPLICATION

This application is a Continuation of U.S. application Ser. No. 11/509,139 filed Aug. 24, 2006, now U.S. Pat. No. 7,529,969 which is incorporated herein its entirety by reference.

TECHNICAL FIELD

Various embodiments described herein relate to apparatus, systems, and methods associated with memory devices, including storage and retrieval of memory device operational parameters.

BACKGROUND INFORMATION

Some bad blocks may remain in a semiconductor memory device following manufacture of the device. The bad blocks may be identified as defective at the time of performing manufacturing tests on the device. Bad block identification, documentation, and tagging may prevent an accidental use of the bad blocks during operation of the memory device. Some devices may document bad block information on a die or module corresponding to the memory device. The bad block information may include the bad block address or other identifier thereof. Some devices may tag the bad block using fusible link logic. Other devices may store the bad block information in writeable, non-volatile memory cells. Flash memory devices may include such cells, for example.

In the latter case, accessing the bad block information stored in the writeable, non-volatile memory cells to make decisions about whether to use a memory block may be impractical if attempted in real time, during normal memory device operation. Read access times, address compare times, and a logic complexity associated with real-time compare operations may preclude such use of the stored bad block addresses.

Instead, the memory device may execute a bad block tagging sequence upon power-up, before user access to the device is permitted. The memory device may read the stored bad block addresses and may set a "tag" latch associated with each bad block address. During normal device operation after power-up, memory device access logic may attempt to access a given bad block. The logic may sense that the bad block latch is set and consequently skip the access attempt. The tagging operation thus isolates the bad blocks and prevents their accidental use.

Over time, single-bit "disturb event" errors may develop in the stored bad block information due to aging or excessive cycling of the writeable, non-volatile memory cells. A bad block address so affected may cause a bad block not to be tagged, or may result in a good block being tagged as bad.

DETAILED DESCRIPTION

Embodiments disclosed herein may operate to store redundant copies of an operational parameter associated with the internal operation of a memory device in writeable, non-volatile storage cells. A parity bit associated with each of the redundant copies may also be stored. A parity error-free copy of the operational parameter, or a flag associated with the parity error-free copy, may be written to a fast-access working area of the memory device for access during normal device operation. "Fast access" in this context means an access time associated with the working area of the memory device that is substantially shorter than an access time associated with the non-volatile storage cells, perhaps on the order of 1000 times faster.

Consider, for example, an embodiment employing bad-block tagging. The operational parameter in this example may comprise a bad block address. The embodiment may tag bad blocks while reducing the likelihood of incorrectly tagging good blocks if a bit error appears in a bad block information field. This may be accomplished without complex error correction code (ECC) logic.

Two or more copies of a bad block address may be stored in writeable, non-volatile storage cells, perhaps at the time of device manufacture and test. In general, X+1 copies may be stored to protect against X bit errors. During normal use, at device reset, bad block tagging logic may operate to read one copy after another until a parity error-free copy of the bad block address is found. A bad-block flag or latch may be set at a main memory array block corresponding to the parity error-free address read from the writeable, non-volatile parameter storage area.

For simplicity of design, some embodiments may read subsequent copies of the bad block address after encountering the parity error-free copy. Such embodiments may repeatedly set the bad block flag or latch at the block address indicated by each parity error-free address read from each redundant parameter storage area. Some embodiments may employ more than one parity bit per bad block address copy to protect against multiple bit errors. Any of these implementations may reduce the likelihood of incorrectly tagging good blocks if a bit error appears in a bad block information field.

The afore-mentioned bad-block tagging example illustrates a case of setting a flag associated with the operational parameter. Other embodiments may store the operational parameter itself in the fast-access working area. For example, a maximum clocking rate associated with the memory device may be determined during a manufacturing test procedure. This operational parameter may be stored in the writeable, non-volatile parameter storage area during manufacturing. Once deployed in a circuit, the memory device may transfer the maximum clocking rate parameter to the fast-access operational area at each device reset, for access as needed during normal device operation.

Figure 1:
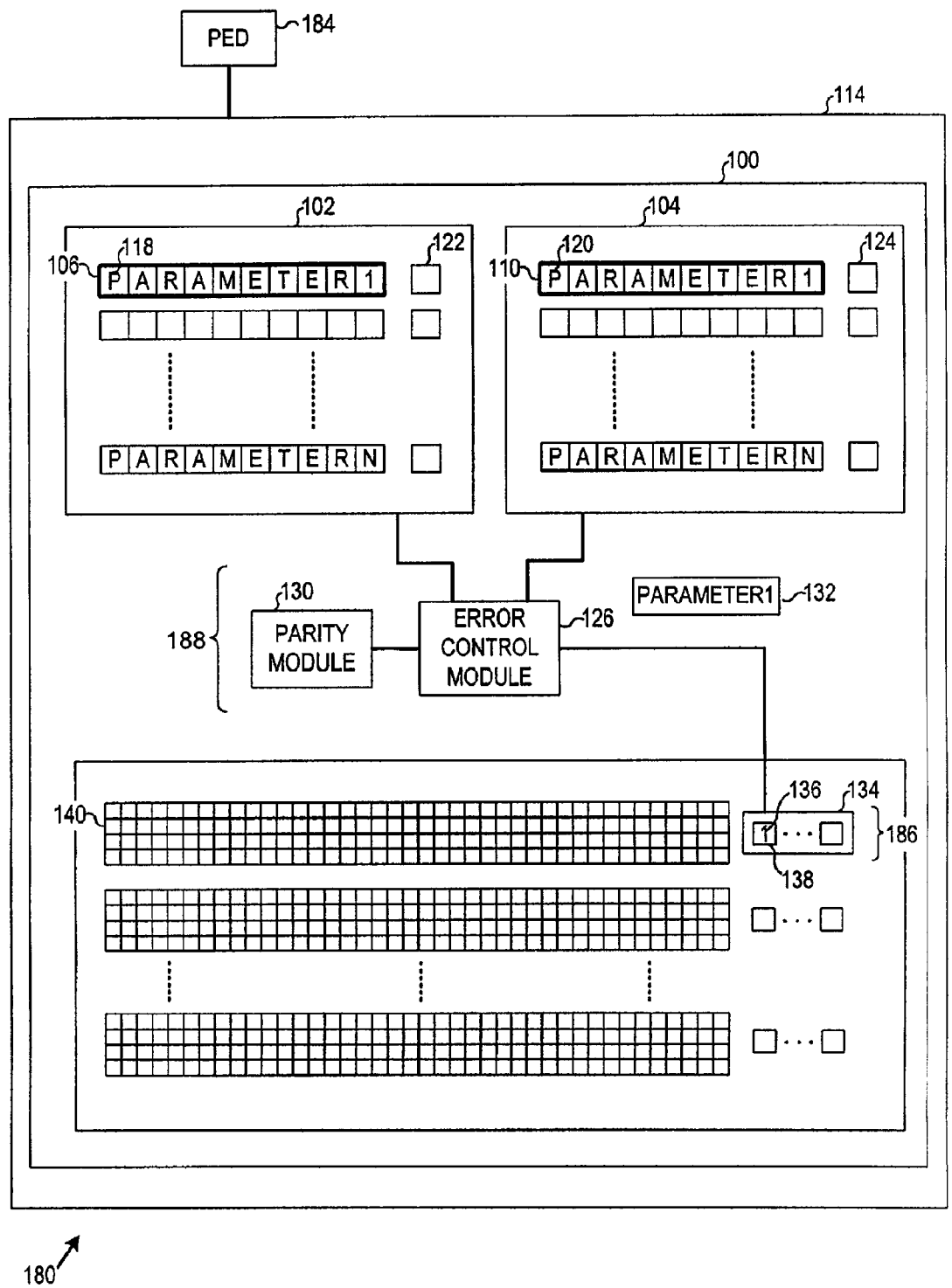
FIG. 1 is a block diagram of an apparatus and a representative system according to various embodiments.

FIG. 1 is a block diagram of an apparatus 100 and a system 180 according to various embodiments of the invention. The apparatus 100 may include a plurality of parameter tables, depicted for simplicity as first and second parameter tables 102 and 104. The parameter tables 102 and 104 may contain one or more operational parameters PARAMETER1 . . . PARAMETERn.

The parameter tables 102 and 104 may comprise a plurality of parameter storage areas, depicted herein for simplicity as first and second sets of writeable, non-volatile storage cells 106 and 110. The first and second sets of storage cells 106 and 110 may comprise NAND-flash storage cells, NOR-flash storage cells, or both. The first and second sets of storage cells 106 and 110 may be associated with a memory device 114. The memory device 114 may comprise one or more of a NAND-flash memory, a NOR-flash memory, a dynamic random-access memory (DRAM), or a static random-access memory (SRAM).

The first and second sets of non-volatile storage cells 106 and 110 may contain first and second redundant copies 118 and 120, respectively, of an operational parameter associated with the memory device 114. The operational parameter may comprise one or more of a bad block address, a redundant row identifier, a redundant column identifier, a device electrical parameter, a device timing parameter, or a device configuration parameter, among others. One or more first parity bits 122 may be associated with the first redundant copy 118 of the operational parameter. One or more second parity bits 124 may be associated with the second redundant copy 120 of the operational parameter.

The apparatus 100 may also include an error control module 126. The error control module 126 may be coupled to the first and second sets of storage cells 106 and 110, respectively. The error control module 126 may attempt to effect a parity error-free read from the first set of storage cells 106, from the second set of storage cells 110, or from both. The error control module 126 may thus utilize the redundant copies 118 and 120 of the operational parameter to increase the likelihood of an error-free retrieval of the operational parameter. A parity module 130 may be coupled to the error control module 126. The parity module 130 may perform a parity check on an as-read copy 132 of the operational parameter.

The apparatus 100 may also include an operational parameter working storage area 134 coupled to the error control module 126. The error control module 126 may populate the operational parameter working storage area 134 with an error-free copy of the operational parameter, with a flag 136 associated with the operational parameter, or with both following a device reset. In a bad block tagging example, the flag 136 may comprise a bit set in a bad block latch 138. The flag 136 may tag a memory block 140 corresponding to the bad block address as defective.

In another embodiment, a system 180 may include one or more of the apparatus 100. The system 180 may also include a portable electronic device (PED) 184 incorporating the apparatus 100 and/or coupled to the apparatus 100. The PED may comprise a cellular telephone, an MP3 player, or a handheld computer, for example, or any other device utilizing semiconductor memory. First and second sets of writeable, parity-protected, non-volatile storage cells 106 and 110 may be associated with a memory module 114, as previously described. The storage cells 106 and 110 may contain first and second redundant copies 118 and 120 of an operational parameter associated with the memory module 114.

A set of volatile latches 186 may store the operational parameter for access during operations associated with the memory module 114. The operations associated with the memory module 114 may include bad block tagging, bad row tagging, bad column tagging, electrical parameter dissemination, timing parameter dissemination, or dissemination of memory module configuration parameters, among other operations. An access time associated with the volatile latches 186 may be shorter than an access time associated with the sets of non-volatile storage cells 106 and 110.

The system 180 may also include control logic 188 coupled to the first and second sets of writeable, parity-protected, non-volatile storage cells 106 and 110. In some embodiments, the control logic 188 may comprise a microcontroller. The control logic 188 may transfer one or more of the redundant copies 118 and 120 of the operational parameter to the set of volatile latches 186 as parity is validated.

Any of the components previously described may be implemented in a number of ways, including embodiments in software. Thus, the apparatus 100; the storage cells 106, 110; the memory device 114; the operational parameter copies 118, 120, 132; the parity bits 122, 124; the error control module 126; the parity module 130; the working storage area 134; the flag 136; the bad block latch 138; the memory block 140; the system 180; the PED 184; the volatile latches 186; and the control logic 188 may all be characterized as "modules" herein.

The modules may include hardware circuitry, single or multi-processor circuits, memory circuits, software program modules and objects, firmware, and combinations thereof, as desired by the architect of the apparatus 100 and the system 180 and as appropriate for particular implementations of various embodiments.

The apparatus and systems of various embodiments may be useful in applications other than protecting a memory device subsystem from consequences of an operational parameter that becomes corrupted due to a flash memory disturb event. Thus, various embodiments of the invention are not to be so limited. The illustrations of the apparatus 100 and the system 180 are intended to provide a general understanding of the structure of various embodiments. They are not intended to serve as a complete description of all the elements and features of apparatus and systems that might make use of the structures described herein.

The novel apparatus and systems of various embodiments may be included in electronic circuitry used in high-speed computers, communication and signal processing circuitry, modems, single or multi-processor modules, single or multiple embedded processors, multi-core processors, data switches, and application-specific modules, including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 2:
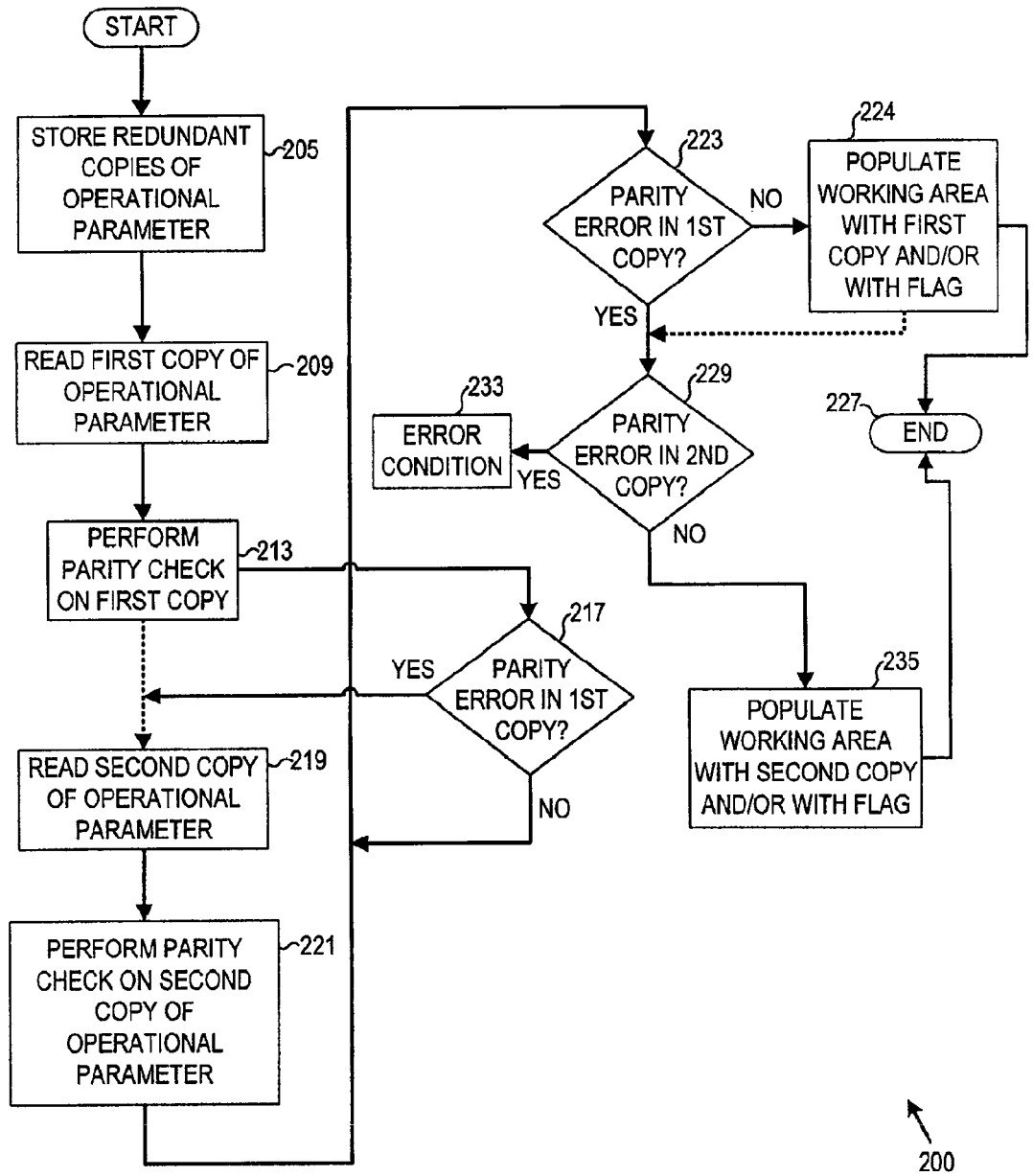
FIG. 2 is a flow diagram illustrating several methods according to various embodiments.

FIG. 2 is a flow diagram illustrating several methods according to various embodiments of the invention. A method 200 may commence at block 205 with storing two or more redundant copies of an operational parameter associated with the internal operation of a memory device. The redundant copies of the operational parameter may be stored in a plurality of sets of writeable, non-volatile storage cells associated with the memory device during manufacturing. The operational parameter may comprise a bad block address, a bad row address, a bad column address, a redundant row identifier, a redundant column identifier, a device electrical parameter, a device timing parameter, or a device configuration parameter, among other parameters. One or more parity bits associated with each one of the redundant copies may also be stored in the plurality of sets of writeable, non-volatile storage cells.

The memory device may comprise a NAND-flash memory, a NOR-flash memory, a DRAM, or a SRAM, among other types of memory. The plurality of sets of writeable, non-volatile storage cells may comprise NAND-flash storage cells, NOR-flash storage cells, or a combination thereof. NAND-flash or NOR-flash memory device embodiments may utilize native non-volatile cells to store the redundant copies of the operational parameter and the associated parity bits. Embodiments employing DRAM, SRAM, or other volatile memory technologies may utilize flash-memory cells fabricated on a die associated with the volatile memory for this purpose. Alternatively, a volatile memory embodiment may combine a volatile technology cell bank with a flash memory module in a hybrid configuration.

The method 200 may continue at block 209 with reading a first redundant copy of the operational parameter. The first redundant copy may be read from a first set of writeable, non-volatile storage cells in the memory device at a time of resetting the memory device. The method 200 may also include performing a parity check operation on the first redundant copy of the operational parameter, at block 213.

In some embodiments, the method 200 may test to determine whether the first redundant copy of the operational parameter was read with a parity error, at block 217. If so, the method 200 may continue at block 219 with reading a second redundant copy of the operational parameter from a second set of writeable, non-volatile storage cells. The method 200 may also perform a parity check on the second redundant copy of the operational parameter, at block 221. In some embodiments, the method 200 may read and check parity for the second redundant copy regardless of whether the first redundant copy was read with a parity error.

The method 200 may continue at block 223 with again testing whether the first redundant copy of the operational parameter was read with a parity error. If the first redundant copy was read with a parity error, the method 200 may proceed to block 229, as described below. If the first redundant copy was not read with a parity error, the method 200 may populate a working area of the memory device with the first redundant copy and/or a flag associated with the first redundant copy, at block 224.

The working area of the memory device may comprise a set of volatile, high-speed latches. In an example embodiment, the operational parameter may comprise a bad block address. A bit may be set as a flag in a bad block latch to tag a memory block as unusable.

In some embodiments, the method 200 may terminate at block 227. In other embodiments, the method 200 may continue with testing to determine whether the second redundant copy of the operational parameter was read with a parity error, at block 229. If the second redundant copy was read with a parity error and no additional redundant copies of the operational parameter are available, the method 200 may generate an error condition, at block 233.

If the second redundant copy of the operational parameter was read without a parity error, the method 200 may continue at block 235 with populating the working area of the memory device with the second redundant copy and/or with a flag associated with the second redundant copy. The method 200 may then terminate at block 227.

It may be possible to execute the activities described herein in an order other than the order described. The various activities described with respect to the methods identified herein may be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment. Thus, other embodiments may be realized, as discussed regarding FIG. 3 below.

Figure 3:
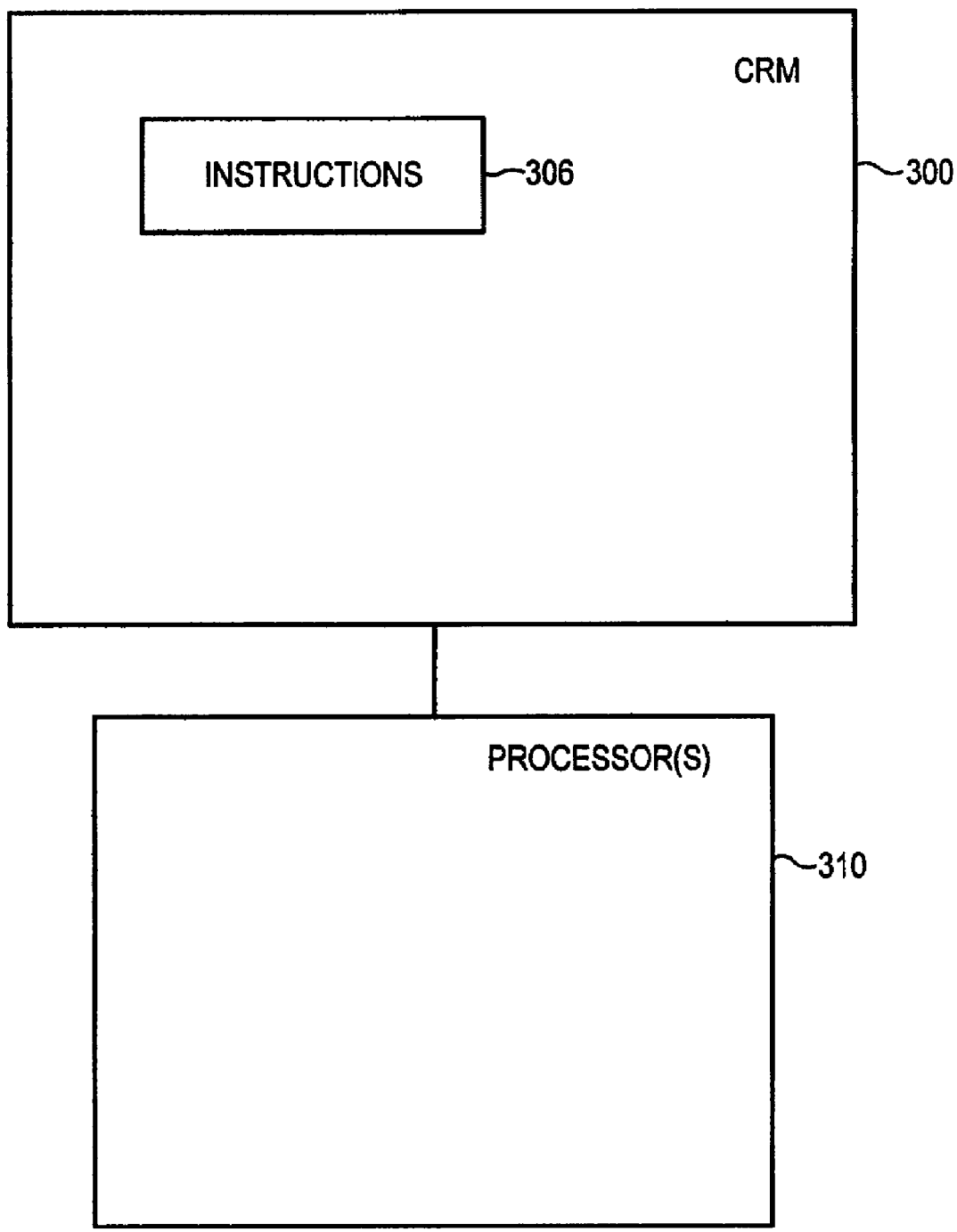
FIG. 3 is a block diagram of a computer-readable medium according to various embodiments.

FIG. 3 is a block diagram of a computer-readable medium (CRM) 300 according to various embodiments of the invention. Examples of such embodiments may comprise a memory system, a magnetic or optical disk, or some other storage device. The CRM 300 may contain instructions 306 which, when accessed, result in one or more processors 310 performing any of the activities previously described, including those discussed with respect to the methods 200 noted above.

Implementing the apparatus, systems, and methods disclosed herein may protect a memory device subsystem from the consequences of depending on an operational parameter that becomes corrupted due to a flash memory disturb event. Systems utilizing the memory device may experience an increased reliability as a result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
   a first set of storage cells configured to store a copy of an operational parameter associated with a memory device;

a second set of storage cells configured to store the same copy of the operational parameter; and a control module configured to perform an operation on the copy of the operational parameter retrieved from at least one of the first and second sets of storage cells.

2. The apparatus of claim 1 further comprising:

a first storage area to store a first parity information associated with the copy of the operational parameter stored in the first set of storage cells; and a second storage area to store a second parity information associated with the copy of the operational parameter stored in the second set of storage cells.

3. The apparatus of claim 1, wherein the control module is configured to perform a parity check on the copy of the operational parameter stored in the first set of storage cells when the copy of the operational parameter stored in the first set of storage cells is read.

4. The apparatus of claim 3, wherein the control module is configured to perform a parity check on the copy of the operational parameter stored in the second set of storage cells regardless of whether or not the copy of the operational parameter stored in the first set of storage cells is read with a parity error.

5. The apparatus of claim 1, wherein the control module is configured to perform the operation on the copy of the operational parameter retrieved from the second set of storage cells after the control module reads the copy of the operational parameter from the first set of storage cells regardless of whether or not the copy of the operational parameter stored in the first set of storage cells is read with a parity error.

6. The apparatus of claim 1, wherein the control module is configured to set a flag, based on the operation on the copy of the operational parameter, to tag a memory block of the memory device.

7. The apparatus of claim 1, wherein the control module is configured to perform the operation on the copy of the operational parameter during reset of the memory device.

8. The apparatus of claim 1, wherein the first set of storage cells is configured to store an address of at least one bad memory cell of the memory device.

9. The apparatus of claim 1, wherein the first and second sets of storage cells include non-volatile storage cells.

10. The apparatus of claim 1, wherein the memory device includes a non-volatile memory device.

11. The apparatus of claim 1, wherein each of the first and second sets of storage cells is configured to store the copy of the operational parameter that includes at least one of bad block tagging, bad row tagging, bad column tagging, electrical parameter dissemination, timing parameter dissemination, and dissemination.

12. An apparatus comprising:

a first set of storage cells configured to store a copy an address of a bad memory portion of a memory device;

a second set of storage cells configured to store the same copy; and a control module configured to read the copy from at least one of the first and second sets of storage cells.

13. The apparatus of claim 12 further comprising:

a first storage area to store a first parity information associated with the copy stored in the first set of storage cells; and a second storage area to store a second parity information associated with the copy stored in the second set of storage cells.

14. The apparatus of claim 12, wherein the control module is configured to perform a parity check on the copy stored in the first set of storage cells when the copy stored in the first set of storage cells is read.

15. The apparatus of claim 14, wherein the control module is configured to perform a parity check on the copy stored in the second set of storage cells when the copy stored in the second set of storage cells is read after the parity check on the copy stored in the first set of storage cells is performed.

16. The apparatus of claim 12 further comprising a storage area to store a flag corresponding to the address of the bad memory portion.

17. The apparatus of claim 12, wherein the control module is configured to populate an area of the memory device with the copy stored in the first set of storage cells if the copy stored in first set of storage cells is read without error.

18. The apparatus of claim 17, wherein the control module is configured to populate an area of the memory device with the copy stored in the second set of storage cells if the copy stored in first set of storage cells is read with error.

19. A method comprising:

storing a first copy of an operational parameter associated with a memory device;

storing a second copy of the operational parameter; and populating an area of the memory device with at least one of the first copy of the operational parameter and a flag associated with the first copy of the operational parameter if the first copy of the operational parameter is read without error.

20. The method of claim 19 further comprising:

populating the area of the memory device with at least one of the second copy of the operational parameter and a flag associated with the second copy of the operational parameter if the first copy of the operational parameter is read with error and if the second copy of the operational parameter is read without error.

21. The method of claim 19, wherein storing each of the first and second copies of the operational parameter includes storing an address associated with a bad memory block of the memory device.

22. The method of claim 19 further comprising:

performing a parity check on the first copy of the operational parameter when the first copy of the operational parameter is read.

23. The method of claim 22 further comprising:

performing a parity check on the second copy of the operational parameter when the second copy of the operational parameter is read.

24. The method of claim 23 further comprising:

performing the parity check on the second copy of the operational parameter regardless of whether or not the first copy of the operational parameter is read with a parity error.

25. The method of claim 23 further comprising:

generating an error indication if each of the first and second copies of the operational parameter is read with a parity error.

26. An apparatus comprising:

a first set of flash storage cells configured to store a copy of an operational parameter associated with a flash memory device;

a second set of flash storage cells configured to store the same copy of the operational parameter; and a control module configured to perform an operation on the copy of the operational parameter retrieved from at least one of the first and second sets of flash storage cells.

27. The apparatus of claim 26 further comprising:
a first flash storage area to store a first parity information associated with the copy of the operational parameter stored in the first set of flash storage cells; and
a second flash storage area to store a second parity information associated with the copy of the operational parameter stored in the second set of flash storage cells.

28. The apparatus of claim 26, wherein the control module is configured to perform a parity check on the copy of the operational parameter stored in the first set of flash storage cells when the copy of the operational parameter stored in the first set of flash storage cells is read.

29. The apparatus of claim 28, wherein the control module is configured to perform a parity check on the copy of the operational parameter stored in the second set of flash storage cells regardless of whether or not the copy of the operational parameter stored in the first set of flash storage cells is read with a parity error.

* * * * *